United States Patent [19]

Maruyama et al.

[11] Patent Number: 5,461,316
[45] Date of Patent: Oct. 24, 1995

[54] IGNITION COIL WITH MISFIRE DETECTING CAPACITOR FOR INTERNAL COMBUSTION ENGINE

[75] Inventors: Shigeru Maruyama; Yuichi Shimasaki; Masaki Kanehiro; Shigeki Baba; Takuji Ishioka; Takashi Hisaki, all of Saitama, Japan

[73] Assignee: Honda Giken Kogyo Kabushiki Kaisha, Tokyo, Japan

[21] Appl. No.: 51,668

[22] Filed: Apr. 26, 1993

[30] Foreign Application Priority Data

Apr. 28, 1992 [JP] Japan ................................ 4-136249

[51] Int. Cl.⁶ ........................ F02P 17/00; G01R 19/00; F23Q 23/00
[52] U.S. Cl. ...................... 324/402; 324/393; 324/126; 73/116
[58] Field of Search ...................... 324/385, 388, 324/392, 402, 548, 72.5, 457, 393, 395, 399, 400, 126, 133; 73/116, 117.3

[56] References Cited

U.S. PATENT DOCUMENTS

| | | | |
|---|---|---|---|
| 3,538,440 | 11/1970 | Galloway | 324/126 |
| 3,970,932 | 7/1976 | Harvey | 324/133 |
| 4,349,782 | 8/1982 | Doss | 324/402 |
| 4,825,167 | 4/1989 | Bayba | 324/399 |
| 5,237,278 | 8/1993 | Burnen | 324/402 |
| 5,293,129 | 3/1994 | Ikeuchi et al. | 324/399 |
| 5,317,267 | 5/1994 | Miyata et al. | 324/402 |
| 5,363,046 | 11/1994 | Shimasaki et al. | 324/402 |

FOREIGN PATENT DOCUMENTS 52-118135 10/1977 Japan.
3-326509 11/1991 Japan.

OTHER PUBLICATIONS

Pub. (Patent Specification GB 1,137,159), Aktiengesellschaft, Dec. 1968, Improvements in or relating to the testing of shielded ignition installation.

Primary Examiner—Sandra L. O'Shea
Assistant Examiner—Jay M. Patidar
Attorney, Agent, or Firm—Nikaido, Marmelstein, Murray & Oram

[57] ABSTRACT

An ignition coil has a capacitor for detecting ignition voltage of a spark-ignition internal combustion engine to determine if misfire occurs. The ignition coil has a primary winding and a secondary winding both wound around a core. A connector section, connected to the secondary winding by a lead, is provided for receiving a high-voltage cable to transmit the secondary winding voltage current to an ignition distributor. These components are embedded integrally in an insulator resin at the time of completing the coil. A conductor is also embedded in the insulator resin such that it is located around the connector section keeping a predetermined distance therefrom and sandwiching the insulator resin, whereby a capacitor, which constitutes a capacitive divider in cooperation with a second capacitor for detecting misfire through the ignition voltage, is formed between the connector section and the conductor. A ceramic insulator can be positioned between the conductor and the connector section. The conductor can further be electrically shielded.

10 Claims, 5 Drawing Sheets

IGNITION COIL WITH MISFIRE DETECTING CAPACITOR FOR INTERNAL COMBUSTION ENGINE

BACKGROUND OF THE INVENTION

1. Field of the Invention

This invention relates to a technology for detecting misfire occurring during operation of a gasoline or other spark-ignition internal combustion engine and more particularly to an ignition coil with a capacitor for detecting misfire for an internal combustion engine.

2. Description of the Prior Art

As is well known, in gasoline and other types of internal combustion engines a high voltage produced by an ignition coil is distributed to spark plugs at the engine cylinders by an ignition distributor or the like. At each cylinder, the resulting electric discharge between the spark plug electrodes produces a spark which ignites an air-fuel mixture that has been drawn into the cylinder and compressed at the proper time, causing the mixture to hum explosively. In the course of this ignition-combustion process in the internal combustion engine, the mixture may for some reason occasionally fail to hum properly. This is referred to as a misfire. Misfires can result from causes in either the fuel system or the ignition system. Misfires caused by problems in the fuel system are the result of an overly lean or overly rich air-fuel mixture. A spark is produced between the spark plug electrodes hut the air-fuel mixture does not ignite. Misfires caused by problems in the ignition system are the result of spark plug electrode fouling or ignition circuit malfunctions which prevent normal spark discharge.

The occurrence of misfire in the course of engine operation not only degrades engine performance but may degrade fuel consumption, or may cause after-firing of unburned gases in the exhaust system which can affect the exhaust emission control system and have other adverse effects. Moreover, since the occurrence of even a single misfire indicates a misadjustment or malfunction in the fuel or ignition system, prompt elimination of the problem is essential. Because of this, there is a strong need for development of a detector for detecting misfires as soon as they occur.

The only type of misfire detector that has been proposed is the mis-spark detector described in Japanese Laid-open Patent Publication No. 52(1977)-118135. As shown in FIG. 6, the detector includes a conductor 51 wrapped around a portion of a high-voltage (high tension) cable 50 of the engine ignition system so as to constitute a detection capacitor 52 (a type of capacitance probe) in which the insulation cladding 50A of the high-voltage cable 50 serves as the dielectric. A voltage divider capacitor 53 is connected between the capacitor 52 and ground so that the ignition voltage (secondary voltage of the ignition coil) applied to the conductive core 50B of the high-voltage cable 50 induces a voltage across the terminals of the capacitor 52 due to its static capacitance. The induced voltage is statically divided by the capacitor 52 and the capacitor 53, and the voltage across the terminals of the capacitor 53 (the divided voltage) is forwarded as a detection voltage to an electronic circuit 54 for processing and discrimination. The electronic circuit 54 discriminates the occurrence of misfires from the difference between the waveform of the ignition voltage at the time of normal spark discharge and that at the time of no spark discharge (mis-sparking). Among the different types of misfires, the detector thus detects misfires that occur when no spark discharge is produced waveform to a problem in the ignition system.

Another detector for detecting misfire in internal combustion engines is disclosed in the present assignee's Japanese Patent Application No. 3(1991)-326509. In this detector, the ignition voltage is similarly detected through the capacitive divider, and misfire due to causes in the fuel system is detected based on the fact that, even when spark discharge occurs, the waveform of the ignition voltage differs between the case where normal combustion occurs and the case where it does not.

In the conventional misfire detectors, as the means for detecting ignition voltage there is thus used such a "capacitance probe" constituted by wrapping a sheet or ribbon of conductor around the high-voltage cable of the ignition system so as to form the detection capacitor between the conductor and the core of the high-voltage cable via the insulation cladding of the high-voltage cable as the dielectric. However, the capacitance probe constituted in this manner has a major drawback that derives from the nature of the high-voltage cable of the ignition system. Because of its flexibility and elasticity, the high-voltage cable is highly susceptible to vibration. It is also easily affected by changes in the ambient humidity, wetting by leaking water, and fouling with oil, grime and the like. When a capacitor for use in detection is formed by wrapping a conductor ribbon around the cable, the static capacitance of the capacitor is apt to be changed from the proper value by shifting of the conductor caused by vibration as well as by changes in humidity, wetting with water and fouling with oil, grime and the like. Although some change in static capacitance can be tolerated if the capacitor is to be used only for checking the ignition voltage, even slight changes have to be avoided when it is used for misfire discrimination because such discrimination generally requires accurate detection not only of the ignition voltage but also of the ignition voltage waveform. The capacitance changes to which the prior art capacitance probe is susceptible degrade the detected voltage waveform and make it impossible to discriminate misfire with high reliability.

In addition, the insulation cladding of the high-voltage cable is generally formed of synthetic rubber, the synthetic rubber is readily degraded when exposed to heat and fouling with oil and grime. This degradation of the insulation cladding after the detection capacitor has been formed by winding the conductor around the high-voltage cable not only produces a progressive change in the static capacitance of the capacitor over time but also increases the risk of electric insulation breakdown. In this latter case, the high ignition voltage can leak to the conductor wrapped thereon. When this happens, the high leak voltage is apt to be conducted to the electronic circuitry of the misfire detector, which it can damage or cause to malfunction.

In actual practice, moreover, the flexibility and elasticity of the high-voltage cable make the work of attaching the conductor for forming the capacitor on the insulation cladding of the high-voltage cable and securing thereon difficult and troublesome. Maintenance of the so-formed capacitor is also troublesome.

On the other hand, when normal combustion does not occur and ions are therefore not produced at the gap between the spark plug electrodes, natural discharge between the electrodes does not proceed smoothly following insulation breakdown. Instead, the charge developed between the electrodes may flow through the ignition system in reverse. This produces changes in the voltage waveform detected by the detection capacitor or other voltage detection means of the misfire detector and makes it impossible to discriminate the presence/absence of misfire accurately.

Furthermore, the engine compartments of most modern cars are tightly packed with various devices, components and wiring. In providing the detection capacitor of a misfire detector, the conductor for detection constituting a part of the detection capacitor generally ends up being close to some other electrically conductive component. In this case, any change in the distance between the conductor for detection and the nearby conductive component will substantially change the capacitance of the detection capacitor. In addition, the detection capacitor will pick up noise from the nearby conductive component. Since any such change in capacitance or introduction of a noise component adversely affects the ignition voltage waveform detected by the detection capacitor, the detection accuracy is degraded.

SUMMARY OF THE INVENTION

The present invention was accomplished in light of the foregoing circumstances and has as its basic object to provide an ignition coil with a misfire detecting capacitor for a spark-ignition internal combustion engine, which enables the static capacitance of the capacitance probe to be maintained constant, unaffected by mechanical vibration, humidity changes, water-wetting and the like, and also enables a high degree of freedom from the insulation degradation, thus ensuring accurate detection of even the voltage waveform, and which is also easy to install and maintain.

Another object of the invention is to provide an ignition coil with a misfire detecting capacitor for a spark-ignition internal combustion engine which prevents degradation of the accuracy of ignition voltage waveform detection due to substantial change in the capacitance of the detection capacitor or to picked-up noise, even when the conductor for detection constituting a part of the detection capacitor is located in the vicinity of another electrically conductive member.

Still another object of the invention is to provide an ignition coil with a misfire detecting capacitor for a spark-ignition internal combustion engine which prevents the detected voltage waveform from being changed by a current flowing through the ignition system in reverse due to residual charge between the spark plug electrodes at the time of misfire and which thus enables the presence/absence of misfire to be reliably discriminated from the detected voltage wave form.

For realizing these objects, the present invention provides an ignition coil for an internal combustion engine, including, a core; a primary winding and a secondary winding both wound around the core, a first conductor connected to the secondary winding to transmit secondary winding voltage current to the exterior of the coil and an insulator resin at least encompassing the first conductor that the first conductor is embedded integrally therein. In the system the improvement comprises: a second conductor located around the first conductor keeping a predetermined distance from the first conductor and sandwiching the insulator resin such that a first capacitor, which constitutes a capacitive divider with a second capacitor for igniting voltage detection, is formed between the first and second conductors.

BRIEF DESCRIPTION OF THE DRAWINGS

These and other objects and advantages of the invention will be more apparent from the following description and drawings, in which.

DETAILED DESCRIPTION OF THE PREFERRED EMBODIMENTS

For easier understanding of the invention, the explanation of specific embodiments of the ignition coil according to the invention will be preceded by an explanation of a typical conventional ignition coil.

Figure 5:
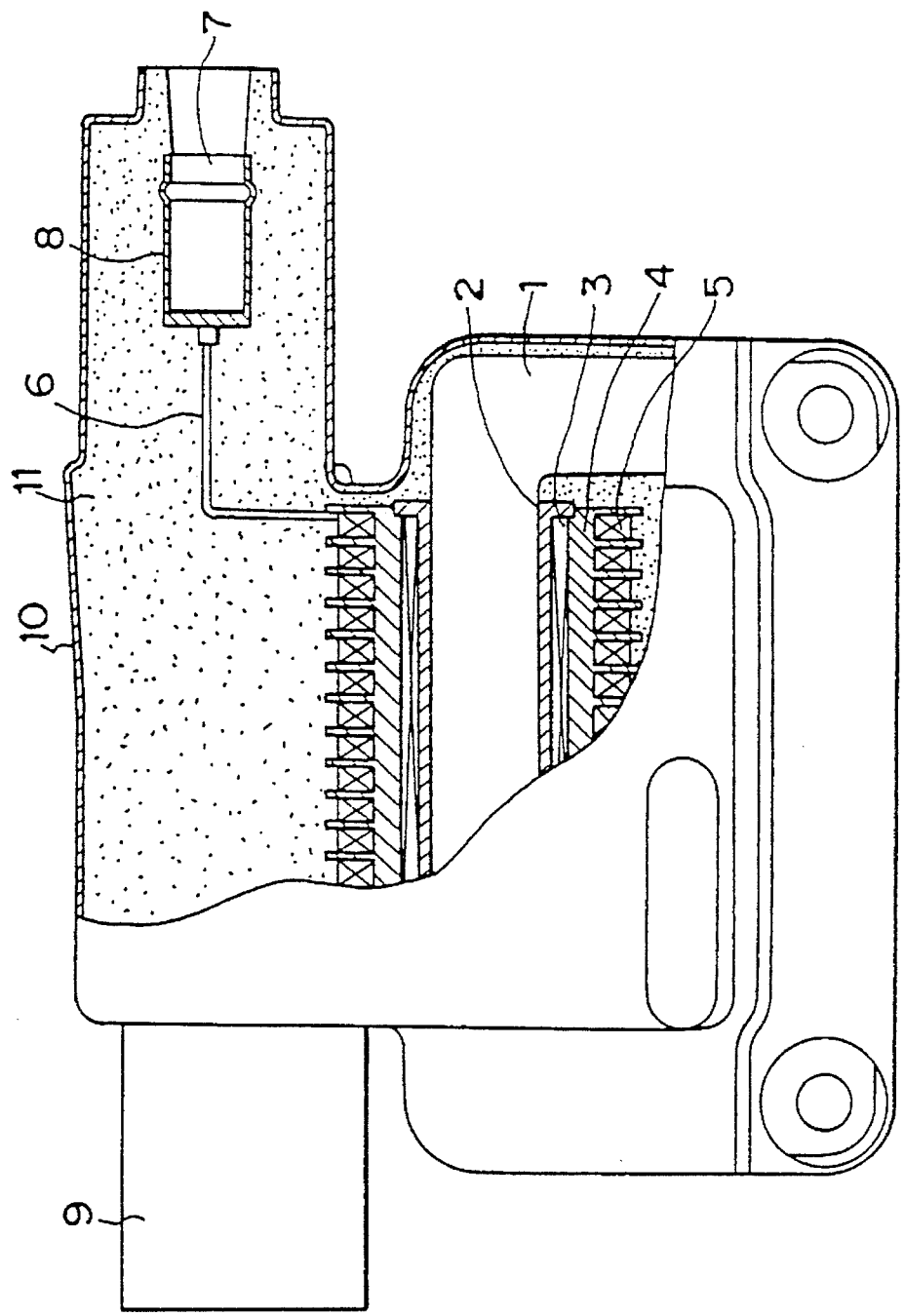
FIG. 5 is a sectional view of a conventional prior art ignition coil.
Figure 6:
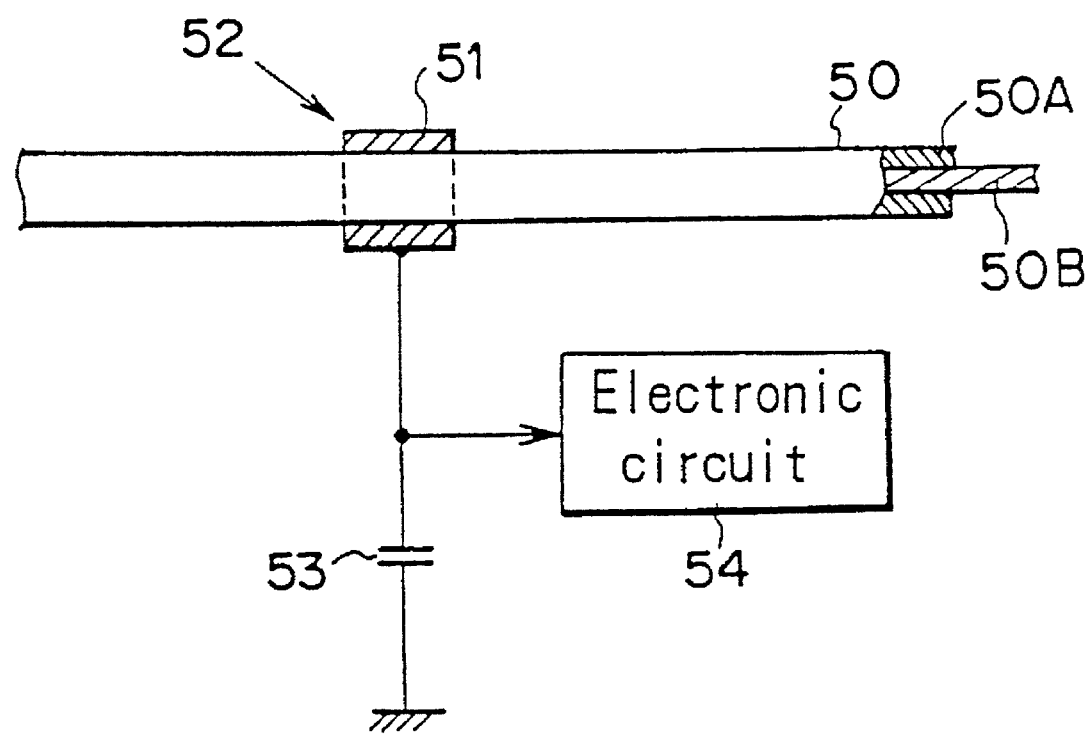
FIG. 6 is a schematic view showing the voltage detection means of a prior art misfire detector.

FIG. 5 shows the structure of a typical prior art ignition coil. As illustrated in the figure, the ignition coil has a metallic core 1, rectangular as a whole, and a first bobbin 2 made of a plastic material is mounted on one side of the core. A primary coil 3 is wound on the first bobbin 2. A second bobbin 4 made of the same material as the first one is further mounted on the primary coil winding 3 and on the second bobbin 4, a secondary coil 5 is wound. The secondary winding 5 is connected, via a lead 6, to a conductor 8 which constitutes a connector section 7 for insertion of the tip of a high-voltage cable (not shown) which will transmit the secondary winding voltage induced at the secondary winding 5 to an ignition distributor (not shown). Similarly another lead (not shown) is provided to connect the primary winding 3 to a second connector section 9, the details of which are omitted from explanation. These components or elements just described are all housed in a case 10 made of a plastic material. The case 10 is filled with an insulator resin 11 such as epoxy resin or the like having electrical insulation property. More specifically, the components or elements are embedded integrally in the resin 11 at the time of completing or fabricating the ignition coil, as illustrated.

Figure 1:
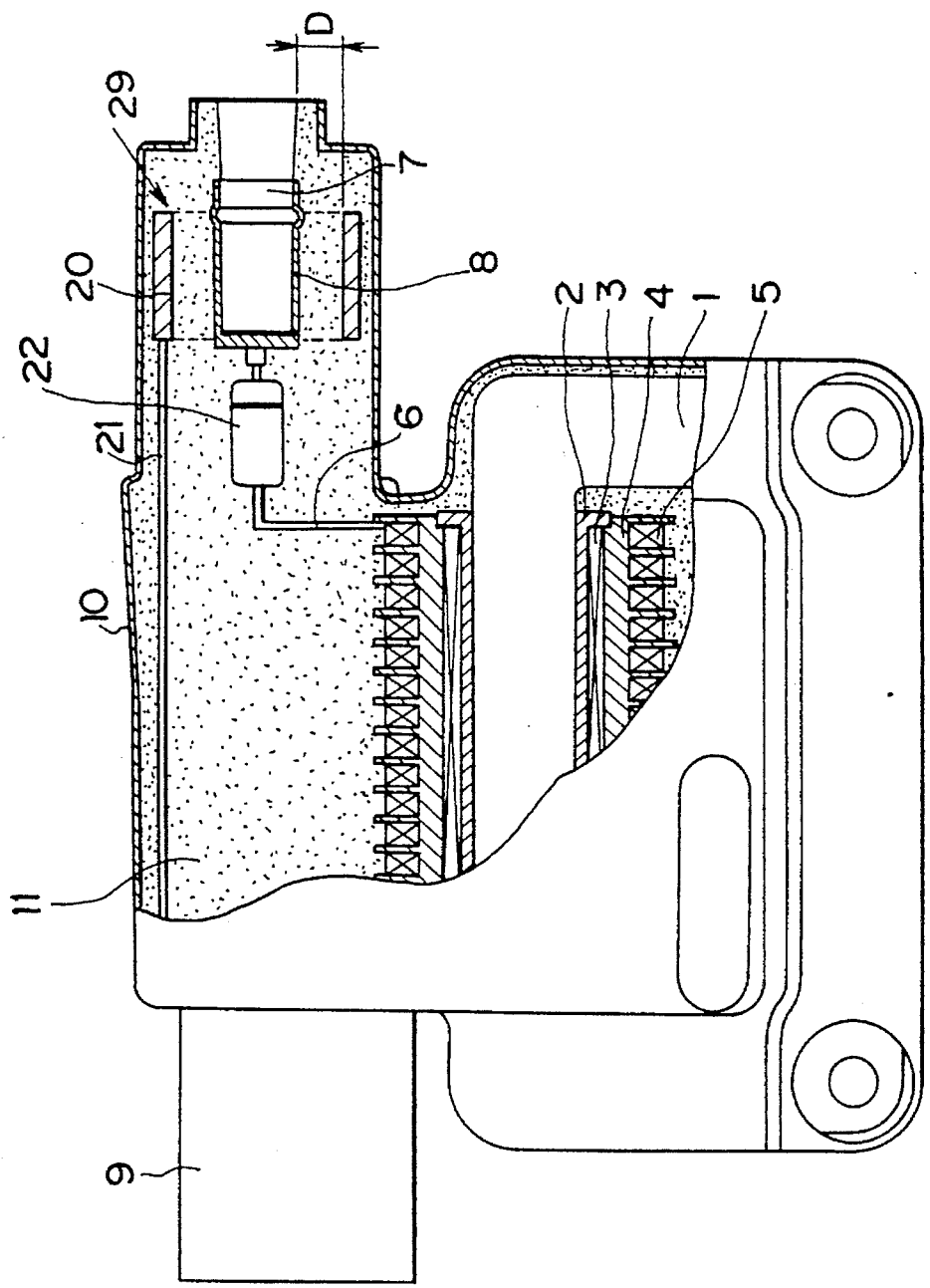
FIG. 1 is a sectional view of an ignition coil with a misfire detecting capacitor for a spark-ignition internal combustion engine according a first embodiment of the invention.

FIG. 1 shows the configuration of an ignition coil according to a first embodiment of the invention. Components or elements in FIG. 1 which correspond to those in FIG. 5 are assigned identical reference numerals to their counterparts in FIG. 5 and will not be explained further.

In the embodiment of FIG. 1, a conductor 20 for detection formed of a good conductor material such as copper or aluminum to have the shape of a hollow tube, a half tube(s) or a split tube(s) is disposed around the conductor 8 for high-voltage conduction at the connector section 7. More specifically, the conductor 20 is embedded integrally in the resin 11 at the connector section 7 when the ignition coil is completed such that the conductor is located around the conductor 8 so as to encompass the same. Thus, since the conductor 20 is integrally embedded in the resin 11 at the time the ignition coil is completed or fabricated, a portion of the resin 11 is present between the inner surface of the conductor 20 and the outer surface of the conductor 8. A lead 21 is connected with the conductor 20 for enabling voltage to be transmitted to the exterior of the ignition coil. Moreover, a current suppression means 22 (e.g. a diode) is inserted at the lead 6. The diode 22 is for suppressing the flow of current in the direction from the connector section 7 toward the secondary winding 5 (i.e. current flow from the spark plug toward the secondary winding). The diode 22 is also embedded in the resin 11 at the time the ignition coil is completed (molded). As a result, in the configuration shown in FIG. 1, the conductor 8 at the connector section 7 and the conductor 20 surrounding it constitute a detection capacitor 29 which has the intervening resin (insulator) 11 as its dielectric.

Figure 2:
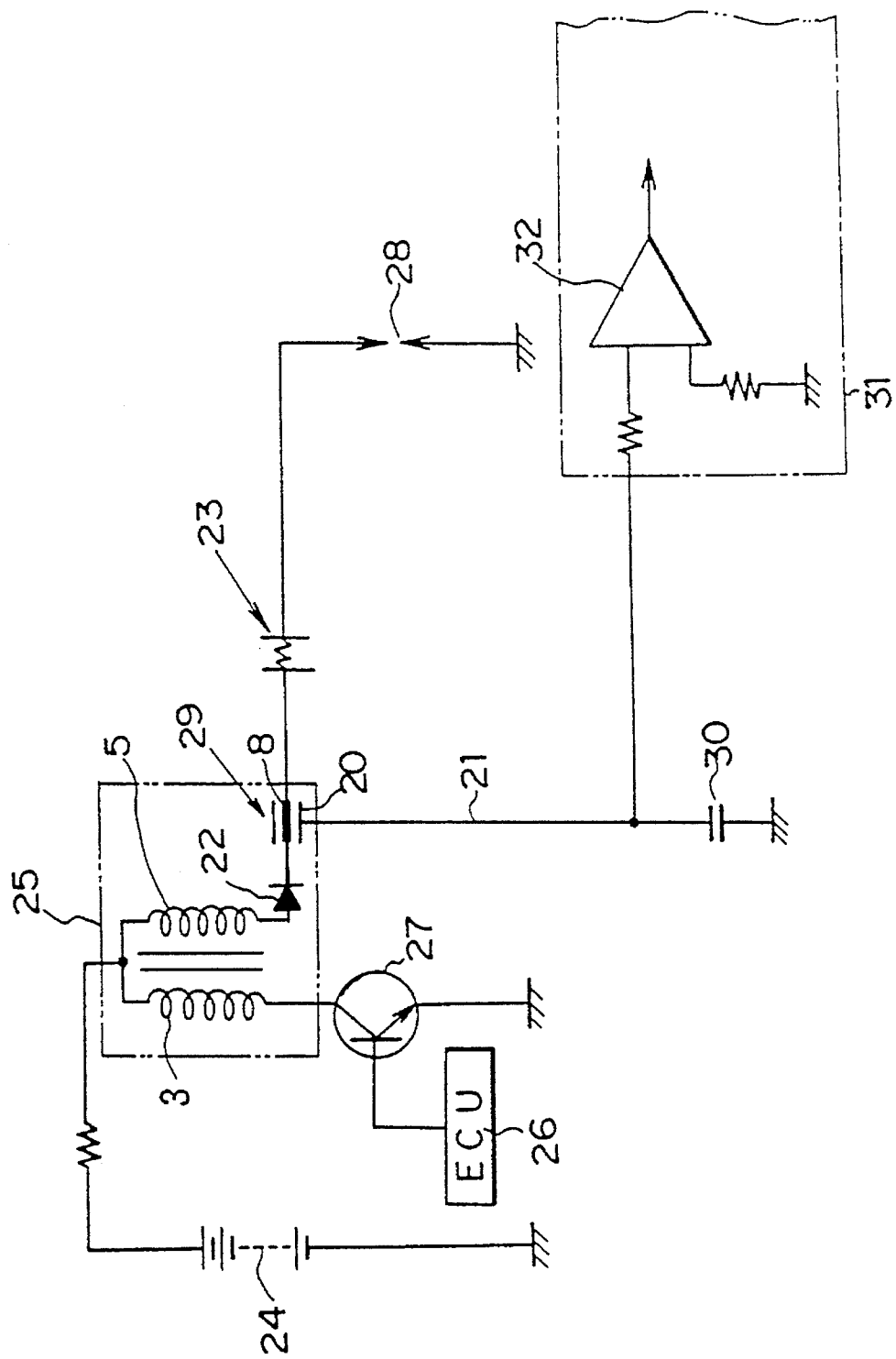
FIG. 2 is a wiring diagram showing the electrical circuitry of an ignition system utilizing the ignition coil of FIG. 1.

FIG. 2 is a schematic diagram showing the electric circuitry of an ignition system including the ignition coil of FIG. 1. Here, the ignition coil is assigned with reference numeral 25. Also shown is an example of the input section of a misfire detector.

In FIG. 2, current flowing from a battery 24 through the primary winding 3 of the ignition coil 25 is turned on and off by a power transistor 27 in response to ignition signals from an engine control unit (ECU) 26. The high-voltage current induced in the secondary winding 5 of the ignition coil 25 passes through the diode 22, via an ignition distributor 23, to a spark plug 28. The detection capacitor 29 is formed by providing the conductor 20 around the conductor 8 as was explained earlier. The detection capacitor 29 is connected in series with a voltage divider capacitor 30 by the lead 21. The other terminal of the voltage divider capacitor 30 is grounded and an intermediate point (the voltage division point) between the detection capacitor 29 and the voltage divider capacitor 30 is connected with one terminal of an amplifier 32 on the input side of a misfire detector 31. Here, a high voltage is produced on the secondary winding 5 of the ignition coil 25 every time an ignition signal from the engine control unit 26 causes the power transistor 27 to switch from the on state to the off state and thus cut off the supply of current to the primary winding 3 of the ignition coil 25. The current produced by this high voltage passes through the diode 22, the conductor 8 and the distributor 23 and then to the spark plug 28 where it produces a spark discharge between the terminals of the spark plug 28. The voltage of the current flowing through the conductor 8 at this time is capacitively divided by the capacitors 29, 30, and the capacitive-divided voltage is applied as a detection voltage to the misfire detector 31. The misfire detector 31 compares the waveform of the detection voltage with a reference waveform for discriminating the presence/absence of misfire.

As was explained earlier, when normal combustion does not occur and ions are therefore not produced at the gap between the electrodes of the spark plug 28, then, during the latter half of the discharge period, a current tends to be produced in the opposite direction from the direction of the normal discharge current. However, since this reverse current (tending to flow from the spark plug 28 toward the secondary winding 5) is suppressed by the diode 22, there is no possibility of the ignition voltage being canceled out by the reverse current. Thus, since there is no possibility of the waveform of the ignition voltage being disturbed by any such reverse current, accurate discrimination of the presence/absence of misfire is ensured at all times.

Since the ignition coil components such as the core, the primary and secondary windings and connector section or the like are integrally embedded in the insulator resin and the conductor 20 for detection is also embedded in the resin as a whole, any vibration it does receive will not shift the position of the conductor 20 or deform the same. In addition, since the conductor 20 for detection is located inside the ignition coil while being embedded in the resin, the conductor is isolated from changes in humidity and other ambient conditions and is also safe from the invasion of oil, grime and the like from the outside. Moreover, the insulator resin is present between the conductor 20 and the connector section as the dielectric. Thus, it is no longer needed to use the cladding of the high-voltage cable such as a material made of synthetic rubber which is readily degraded when exposed to heat or the like.

For enhancing the accuracy of voltage waveform detection, it is preferable to maximize the static capacitance of the detection capacitor 29 by reducing as far as possible the distance D, shown in FIG. 1, between the conductor 20 and the conductor 8 constituting the detection capacitor 29. However, reducing the distance D too far may lead to degradation of the insulation property by corona discharge and, therefore, may result in a high leak voltage being applied to the misfire detector through the conductor 20. In the embodiment shown in FIG. 1, a part of the resin 11 (usually epoxy resin) is present between the conductor 20 and the conductor 8. Generally speaking, however, the insulation characteristics of a resin are inferior to those of ceramics and the like. Therefore, in a configuration in which only resin is present between the conductor 20 and the conductor 8, it becomes necessary to establish a relatively large distance D so as to preclude insulation degradation due to corona discharge. Since some sacrifice of static capacitance is therefore unavoidable, the degree to which the accuracy of ignition voltage waveform detection can be improved is limited.

Figure 3:
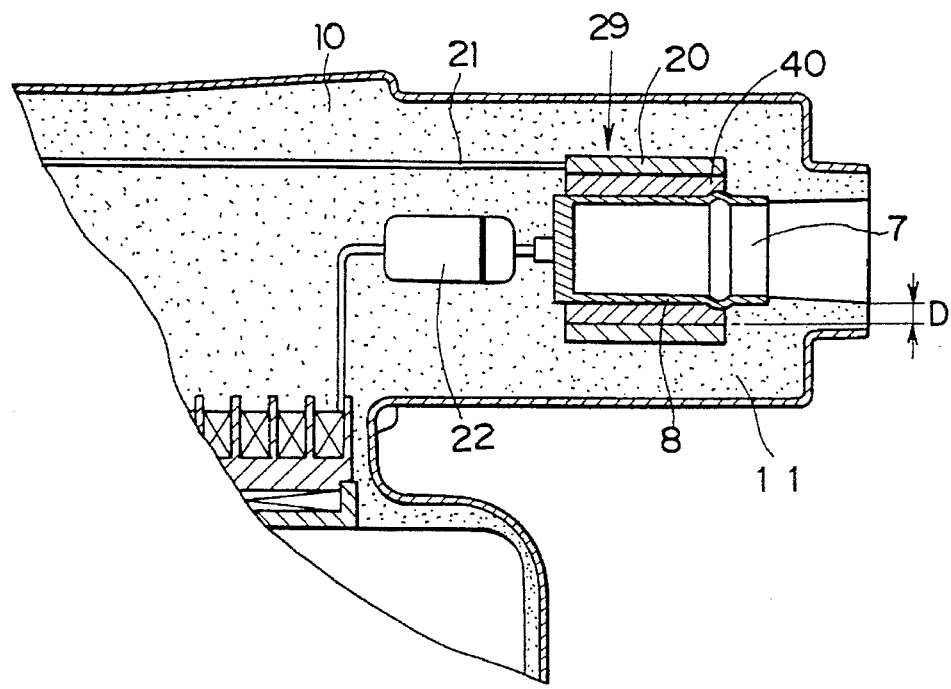
FIG. 3 is an enlarged sectional view of a portion of an ignition coil according to a second embodiment of the invention.

FIG. 3 shows an ignition coil according to a second embodiment of the invention for solving this problem. As shown in the figure, an insert 40 made up of ceramic exhibiting excellent insulation characteristics is disposed between the inner surface of the conductor 20 and the conductor 8 to take the place of the intervening resin material. When a ceramic is used as the insert 40, it is convenient to bake or bond the ceramic onto the inner surface of the conductor 20 in advance and then to embed the result integrally into the resin at the time of fabricating the ignition coil.

Figure 4:
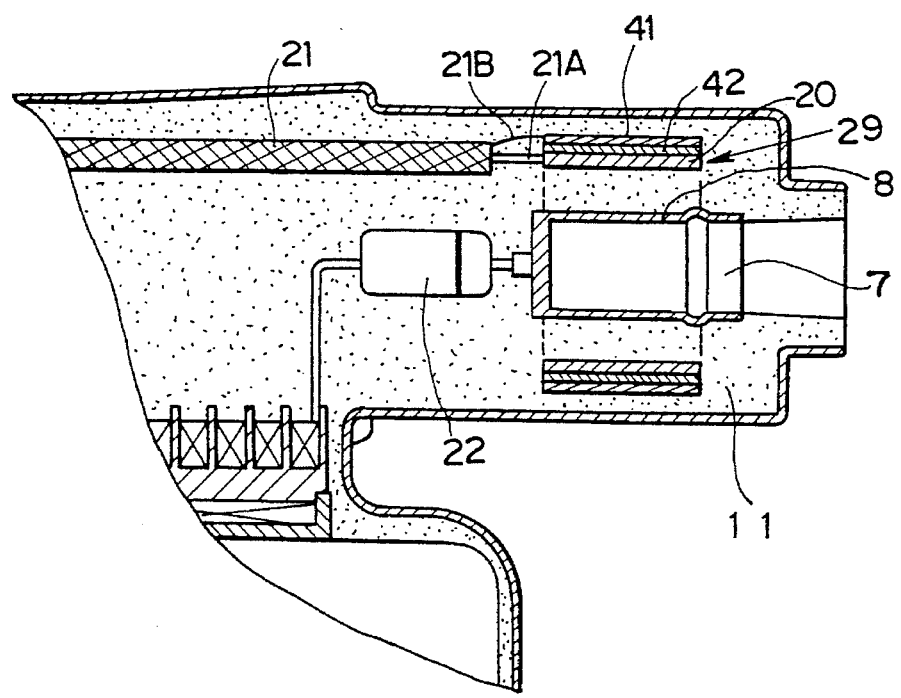
FIG. 4 is an enlarged sectional view of a portion of an ignition coil according to a third embodiment of the invention.

FIG. 4 shows an ignition coil according to a third embodiment of the invention, in which a shield member 41 is provided around the conductor 20.

The shield member 41 of FIG. 4 is fabricated from screen, net, foil or thin sheet of a good conductor material such as copper or aluminum and is disposed to be concentric with the conductor 20 at a fixed distance outward thereof. An insulation layer 42 is sandwiched between the conductor 20 and the shield member 41. The insulation layer 42 can be a resin material which also serves as a boding agent for bonding the shield member 41 to the outer surface of the conductor 20, or can be formed of the same type of the insulator resin 11. In addition, the shield member 41 can be embedded integrally in the resin at the time of completing the ignition coil. In order for the shield member 41 to exhibit a shield effect it has to be electrically grounded. Where a shielded wire is used for the aforementioned lead 21, as is normally the case, the grounding of the shield member 41 can be easily accomplished by connecting the conductive core 21A of the lead 21 to the conductor 20 and connecting the electrically grounded outer shield member 21B of the lead 21 to the shield member 41.

In the third embodiment, since the shield member 41 is provided to surround the conductor for detection. Therefore, even in a case where another conductive member is located near the connector section 7 of the ignition coil, there is little risk of the capacitance of the capacitor 29 for detection being caused to vary due to changes in the distance between the connector section 7 of the ignition coil and the conductive member or the capacitor for detection picking up noise from the conductive member. It may alternatively possible to in the third embodiment to provide, instead of the resin 11, the aforesaid ceramic insert 40 between the conductors 8 and 20.

The present invention has thus been shown and described with reference to the specific embodiments. However, it should be noted that the present invention is in no way limited to the details of the described arrangements, changes and modification may be made without departing from the scope of the appended claims.

What is claimed is:

1. An ignition coil for an internal combustion engine, comprising:

a core;

a primary winding and a secondary winding both wound around the core;

a first conductor connected to the secondary winding to transmit secondary winding voltage current to the exterior of the ignition coil, wherein the first conductor comprises a connector section connected to the secondary winding by a lead, and receiving a high-voltage cable for transmitting the secondary winding voltage;

an insulator resin at least encompassing the first conductor such that the first conductor is embedded integrally therein and said connector section is embedded therein; and a second conductor located around and at least partially encircling the first conductor and keeping a predetermined distance from the first conductor and embedded in the insulator resin for forming a first detection capacitor with the first conductor, and the second conductor is located around and at least partially encircling the connector section in the insulator resin, said first detection capacitor being plastic molded in the insulator resin with said ignition coil, said first detection capacitor constituting a capacitive divider with a second capacitor, said second capacitor being grounded, said capacitive divider forming an ignition voltage detector.

2. An ignition coil according to claim 1, wherein the second conductor is a metal tube encircling the first conductor.

3. An ignition coil according to claim 1, wherein the second conductor is metal tube segments encircling the first conductor.

4. An ignition coil according to claim 1, wherein a ceramic insulator is provided between the first conductor and the second conductor.

5. An ignition coil according to claim 1, wherein a ceramic insulator is provided between the connector section and the second conductor.

6. An ignition coil according to claim 1, wherein the second conductor is electrically shielded.

7. An ignition coil according to claim 1, further including:

current blocking means, provided between the first conductor and the secondary winding, for blocking current from flowing in the first conductor from a spark plug to the secondary winding.

8. An ignition coil according to claim 7, wherein said current blocking means is a diode provided in the insulator resin between the first conductor and the secondary winding.

9. An ignition coil according to claim 1, further including:

means for blocking current from flowing in the lead from a spark plug to the secondary winding.

10. An ignition coil according to claim 9, wherein said means is a diode provided in the lead.

* * * * *